US012721195B2

(12) United States Patent
Lee

(10) Patent No.: US 12,721,195 B2
(45) Date of Patent: Aug. 25, 2026

(54) SEMICONDUCTOR PACKAGE AND MANUFACTURING METHOD THEREOF

(71) Applicant: SAMSUNG ELECTRONICS CO., LTD., Suwon-si (KR)

(72) Inventor: Keunyoung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 480 days.

(21) Appl. No.: 18/217,725

(22) Filed: Jul. 3, 2023

(65) Prior Publication Data

US 2024/0136271 A1 Apr. 25, 2024
US 2024/0234285 A9 Jul. 11, 2024

(30) Foreign Application Priority Data

Oct. 24, 2022 (KR) ........................ 10-2022-0137366

(51) Int. Cl.
*H10W 70/65* (2026.01)
*H10W 70/05* (2026.01)
*H10W 90/00* (2026.01)

(52) U.S. Cl.
CPC ........... *H10W 70/65* (2026.01); *H10W 70/05* (2026.01); *H10W 90/701* (2026.01)

(58) Field of Classification Search
None
See application file for complete search history.

(56) References Cited

U.S. PATENT DOCUMENTS

| | | | | |
|---|---|---|---|---|
| 6,506,982 B1 * | 1/2003 | Shigi | H05K 3/403 | 174/262 |
| 7,065,869 B2 | 6/2006 | Kang et al. | | |
| 7,098,407 B2 | 8/2006 | Kim et al. | | |
| 8,159,831 B2 | 4/2012 | Lim | | |
| 9,386,706 B2 | 7/2016 | Han et al. | | |
| 9,591,753 B2 | 3/2017 | Wang et al. | | |
| 2002/0157958 A1 * | 10/2002 | Kikuchi | H10W 70/635 | 204/279 |
| 2005/0039944 A1 * | 2/2005 | Kim | H05K 3/3452 | 174/250 |
| 2009/0179305 A1 * | 7/2009 | Shimizu | H05K 3/242 | 257/E21.585 |
| 2014/0087568 A1 | 3/2014 | Noda et al. | | |
| 2017/0013710 A1 | 1/2017 | Wang et al. | | |
| 2017/0325330 A1 | 11/2017 | Wang et al. | | |

FOREIGN PATENT DOCUMENTS

| | | |
|---|---|---|
| JP | H11-008335 A | 1/1999 |
| JP | 2004-342922 A | 12/2004 |
| JP | 2014-192205 | 10/2014 |
| JP | 2017-022357 | 1/2017 |
| JP | 6574153 | 9/2019 |
| KR | 10-0237330 | 1/2000 |
| KR | 10-2011-0110078 A | 10/2011 |
| KR | 10-2117481 | 6/2020 |

* cited by examiner

*Primary Examiner* — Cory W Eskridge

(74) *Attorney, Agent, or Firm* — MORGAN, LEWIS & BOCKIUS LLP

(57) ABSTRACT

A semiconductor package includes a substrate. A pattern layer is disposed on a first surface of the substrate. The pattern layer includes a plurality of pads and a plating wire positioned between adjacent pads of the plurality of pads. A first protection layer is disposed on the first surface of the substrate to cover the pattern layer and expose the plurality of pads. At least one pad of the plurality of pads is physically separated from the plating wire.

20 Claims, 10 Drawing Sheets

Comparative Example

SEMICONDUCTOR PACKAGE AND MANUFACTURING METHOD THEREOF

CROSS-REFERENCE TO RELATED APPLICATION

This application claims priority under 35 U.S.C. § 119 to Korean Patent Application No. 10.2022-0137366, filed on Oct. 24, 2022 in the Korean Intellectual Property Office, the disclosure of which is incorporated by reference in its entirety herein.

1. TECHNICAL FIELD

The present disclosure relates to a semiconductor package and a manufacturing method thereof.

2. DISCUSSION OF RELATED ART

An increase in the integration density of semiconductor devices is desired so that more passive or active devices may be integrated within a given region of the semiconductor device. Accordingly, semiconductor chip packaging technology is being developed that provides many input and output signals within a limited area. For example, a ball grid array (BGA) or a land grid array (LGA) method of packaging technology has been developed.

In BGA and LGA packaging technology, a semiconductor chip is attached to an upper surface of a wire substrate and is sealed. A plurality of solder balls or solder pads are arranged on the bottom surface of the wire substrate to form an input/output terminal.

A plurality of pads may be formed to bond the solder balls or the solder pads to the bottom surface of the wire substrate. Since a plurality of pads are exposed to an external environment, plating is required to protect the pads from oxidation or contamination. Accordingly, a plating wire for plating a plurality of pads may be formed together. After the plating process is performed, a process of removing the plating lines extending from a plurality of pads is required. In some embodiments, the plating wire may be formed in a long and complicated shape to extend from the plurality of pads to a separately provided space in the substrate (e.g., a space to perform the plating line removal process).

FIG. 13 is a plan view showing a bottom surface of a wire substrate S used in a conventional packaging technology. Referring to FIG. 13, since an etching area EA for removing a plating wire PL connected to a plurality of pads PP is separately provided in a wire substrate S, the plating wire PL is formed to have a complex shape so that the plating wire PL may be collected in the etching area EA within the wire substrate S. However, the complex shape presents a problem in that the space of the wire substrate S is wasted.

SUMMARY

One aspect is to provide a semiconductor package and a manufacturing method thereof that may reduce the space required for plating the pad in a semiconductor packaging substrate.

According to an embodiment of the present disclosure, a semiconductor package includes a substrate. A pattern layer is disposed on a first surface of the substrate. The pattern layer includes a plurality of pads and a plating wire positioned between adjacent pads of the plurality of pads. A first protection layer is disposed on the first surface of the substrate to cover the pattern layer and expose the plurality of pads. At least one pad of the plurality of pads is physically separated from the plating wire.

In an embodiment, a gap may be disposed between the at least one pad, and the first protection layer and the plating wire.

In an embodiment, the gap may be greater than or equal to about 15 μm.

In an embodiment, a second protection layer is disposed in the gap. The second protection layer is composed of an electrical insulation material.

In an embodiment, a thickness of the second protection layer may be greater than a thickness of the at least one pad.

In an embodiment, the first protection layer may include a plurality of openings exposing a plurality of pads, and a gap may be respectively formed between each opening of a plurality of openings and each pad of a plurality of pads.

In an embodiment, all other pads of the plurality of pads except for the at least one pad may be physically connected to the plating wire, and the first protection layer may expose a portion of the plating wire.

In an embodiment, a plating layer may be disposed on the exposed surface of a plurality of pads.

In an embodiment, a plurality of connection members may be bonded to the plurality of pads.

In an embodiment, a semiconductor chip may be mounted on a second surface of the substrate that is opposite to the first surface of the substrate.

According to an embodiment of the present disclosure, a semiconductor package includes a substrate. A plurality of pads is disposed on a first surface of the substrate. A plating wire is arranged to extend towards each pad of the plurality of pads and is positioned between adjacent pads of the plurality of pads. A first protection layer is disposed on the first surface of the substrate. The first protection layer includes a plurality of openings. The first protection layer covers the plating wire, and exposes the plurality of pads through the plurality of openings. A semiconductor chip is mounted on a second surface of the substrate opposite to the first surface of the substrate. A plurality of connection members is bonded to the plurality of pads. The plurality of connection members electrically connects the semiconductor chip to an external device. The substrate includes a wiring layer electrically connecting the semiconductor chip and the plurality of pads. A gap is formed between at least one pad of the plurality of pads and the plating wire so that the at least one pad of the plurality of pads is physically separated from the plating wire.

In an embodiment, a second protection layer is disposed in the gap, the second protection layer is composed of an electrical insulation material.

According to an embodiment of the present disclosure, a manufacturing method of a semiconductor package includes forming a pattern layer on a first surface of a substrate. The pattern layer includes a plurality of pads and a plating wire positioned between adjacent pads of the plurality of pads. A first protection layer is formed exposing a plurality of pads and covering the plating wire. The plating wire is physically separated from at least one pad by removing the plating wire on a circumference of at least one pad among a plurality of pads.

In an embodiment, the first protection layer may have a plurality of openings. A gap may be formed in each opening of the plurality of openings. The gap extends between the first protection layer and each pad of the plurality of pads.

In an embodiment, in the physical separating of the at least one pad and the plating wire, the plating wire is exposed on the gap and may be etched to be removed.

In an embodiment, a second protection layer may be formed on the gap where the plating wire is removed.

In an embodiment, a thickness of the second protection layer may be greater than a thickness of the at least one pad.

In an embodiment, the gap may be greater than or equal to 15 μm.

In an embodiment, a plurality of connection member may be formed on a plurality of pads. The plurality of connection members electrically connects the semiconductor package to an external device.

In an embodiment, a semiconductor chip is mounted on a second surface of the substrate that is opposite to the first surface of the substrate. The semiconductor chip may be encapsulated with an encapsulant.

According to an embodiment, the space required for the plating of the pad may be reduced by using the space where the protection layer is opened in the pad of an NSMD (non-solder mask defined) type.

In addition, by reducing the space required for the plating, additional design space in the substrate may be secured.

BRIEF DESCRIPTION OF THE DRAWINGS

FIG. 5 is a cross-sectional view showing another form of FIG. 5 according to an embodiment.

DETAILED DESCRIPTION OF EMBODIMENTS

Figure 1:
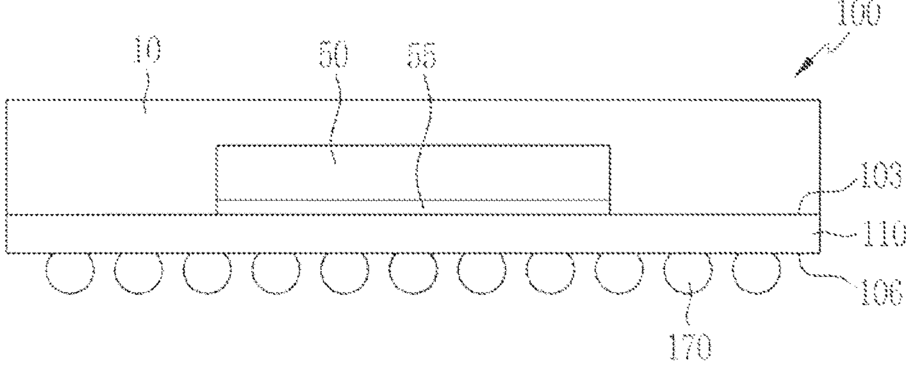
FIG. 1 is a cross-sectional view showing a semiconductor package according to an embodiment.

Hereinafter, an embodiment will be described more fully with reference to the accompanying drawings for a person of ordinary skill to easily implement the present disclosure. As those skilled in the art would realize, the described embodiments may be modified in various different ways, all without departing from the spirit or scope of the present disclosure.

The drawings and description are to be regarded as illustrative in nature and not necessarily restrictive. Like reference numerals designate Ike elements throughout the specification.

The size and thickness of each configuration shown in the drawings may be arbitrarily shown for better understanding and ease of description and embodiments of the present disclosure are not necessarily limited thereto.

Throughout the specification, when it is described that a part is "connected (in contact with, coupled)" to another part, the part may be "directly connected" to the other element or "connected" to the other part through a third part. When it is described that a part is "directly connected (in direct contact with, directly coupled)" to another part, no intervening parts may be present. In addition, unless explicitly described to the contrary, the word "comprise", and variations such as "comprises" or "comprising", will be understood to imply the inclusion of stated elements but not the exclusion of any other elements.

It will be understood that when an element such as a layer, film, region, or substrate is referred to as being another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

Further, in the specification, the phrase "on a plane" means when an object portion is viewed from above, and the phrase "on a cross-section" means when a cross-section taken by vertically cutting an object portion is viewed from the side.

Hereinafter, semiconductor packages of various embodiments will be described with reference to drawings.

FIG. 1 is a view showing a semiconductor package according to an embodiment. FIG. 1 is shown as a cross-sectional view, and some components are omitted or briefly shown for convenience of explanation.

Referring to FIG. 1, a semiconductor package 100 includes a substrate 110 and a semiconductor chip 50.

In an embodiment, the substrate 110 is in a form of a plate, and may have a first surface 103 and a second surface 106 that are opposite to each other (e.g., in a thickness direction of the substrate 110). In addition, a wiring layer that electrically connects the semiconductor chip 50 and a pad 125 (e.g., a connection member 170) to be described later may be included. As an example, the substrate 110 may include a redistribution structure including a plurality of insulation layers, a plurality of redistribution layers (RDL), and a plurality of vias for electrical connection between the redistribution layers.

The semiconductor chip 50 may be mounted on the first surface 103 of the substrate 110. For example, in an embodiment the semiconductor chip 50 may be connected to the substrate 110 through a bonding member 55. The bonding member 55 may include various types of electrical connection of the semiconductor chip 50 and the substrate 110, such as solder and a bonding wire. FIG. 1 shows an embodiment in which one semiconductor chip is disposed on the substrate 110. However, embodiments of the present disclosure are not necessarily limited thereto, and a plurality of semiconductor chips may be disposed on the substrate 110 in some embodiments.

A sealant (e.g., an encapsulant) 10 encapsulating the semiconductor chip 50 may be included on the first surface 103 of the substrate 110. In an embodiment, the sealant 10 may include a molding compound, a molding underfill, an epoxy, and/or a resin, for example, EMC (Epoxy Molding Compounds). However, embodiments of the present disclosure are not necessarily limited thereto.

A plurality of connection members 170 for electrical connection with an external device may be arranged on the second surface 106 of the substrate 110. In an embodiment, the connection member 170 may be arranged in a regular form such as a lattice form, etc. The connection member 170 may be electrically connected to the semiconductor chip 50 by being connected to the substrate 110, and may include an input/output terminal of the semiconductor chip 50.

The connection member 170 may include solder. A embodiment shown in FIG. 1 includes a solder ball in the form of a protruding ball as an example of the connection member 170. However, embodiments of the present disclosure are not necessarily thereto. For example, in some embodiments the connection member 170 may be made of a solder pad (referring to FIG. 6) in the form of a flat pad.

A plurality of pads 125 (referring to FIG. 2, etc.) for connecting a plurality of connection members 170 may be formed on the second surface 106 of the substrate 110. In an embodiment, the pad 125 may include one metal or an alloy of the metal. For example, the pad 125 may include copper (Cu).

On the second surface 106 of the substrate 110, a plating wire (127, referring to FIG. 2, etc.) for plating of the pad 125 may be formed thereon. In an embodiment, the surface of the substrate 110 may be covered with an electrically insulating material, for example, a first protection layer 130, and the pad 125 may be exposed from the first protection layer 130 for connection with the connection member 170. Since the plating prevents the pad 125 exposed to the outside (e.g., an external environment) from being oxidized and contaminated, a plating wire 127 for the plating may be formed on the second surface 106 of the substrate 110 together with the pad 125.

The plating wire 127 may be extended from the pad 125 because it needs electrical connection with the pad 125 during the plating process of the pad 125. In an embodiment, the plating wire 127 may be formed of the same process and a same material as the pad 125, and may be formed of the same layer. According to an embodiment, a pattern layer 120 that includes the plating wire 127 and the plurality of pads 125 may be formed on the second surface 106 of the substrate 110.

However, since the electrical connection between the plating wire 127 and the pad 125 should be disconnected after the plating process, a part of the plating wire 127 may be removed or broken for such disconnection. According to an embodiment, the plating wire 127 and a plurality of pads 125 may be formed on the second surface 106 of the substrate 110, and the plating wire 127 may be formed between the pads of a plurality of pads 125, respectively. For example, the plating wire 127 may extend towards each pad between two pads. In addition, at least one pad among a plurality of pads 125 may be physically separated (e.g., spaced apart) from the plating wire 127 without being directly connected thereto.

For example, by physically separating at least one pad 125 and plating wire 127 among the plurality of pads 125 electrically connected for plating through one power source and the plating wire 127 electrically connecting the pads to each other, it is possible to break the electrical connection through the plating wire 127 between a plurality of pads 125.

Hereinafter, the semiconductor package 100 according to an embodiment having the above-described characteristics is described in further detail with reference to accompanying drawings.

Figure 2:
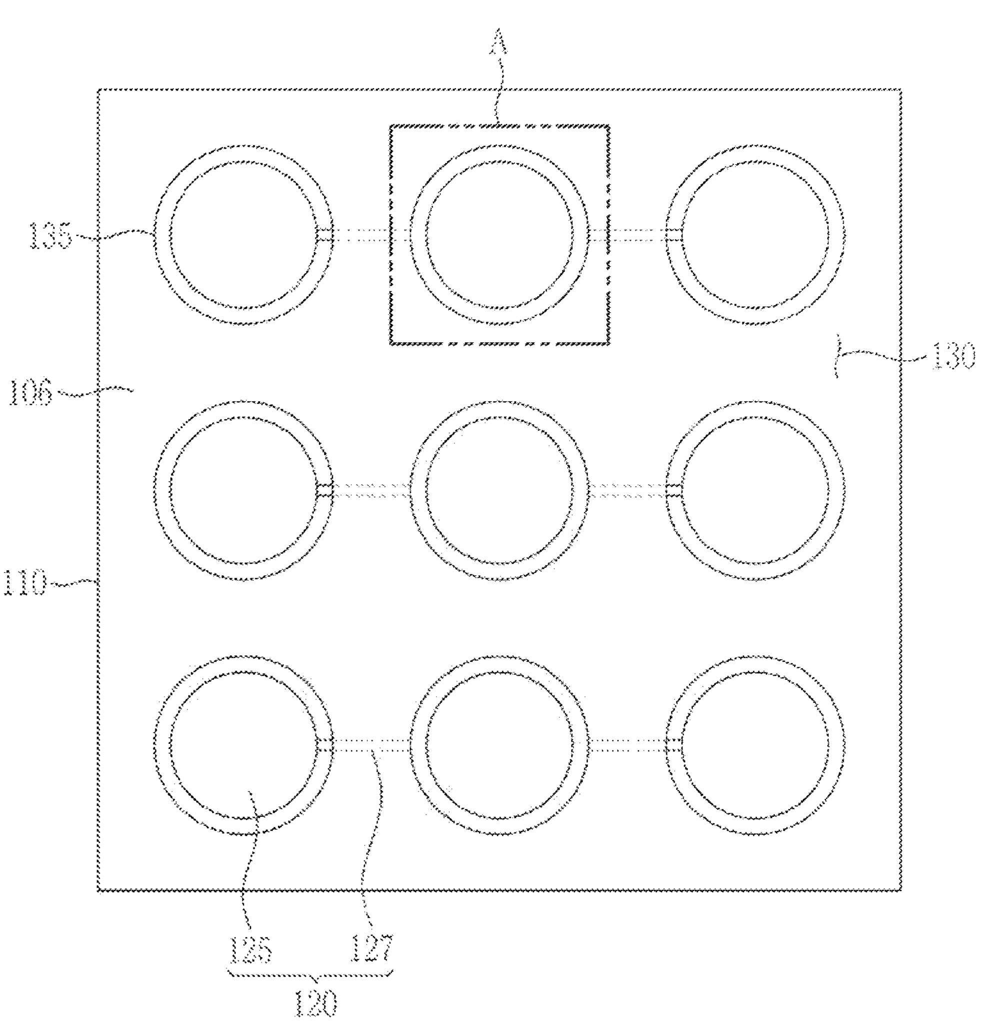
FIG. 2 is a top plan view showing one surface of a substrate in a semiconductor package according to an embodiment.
Figure 3:
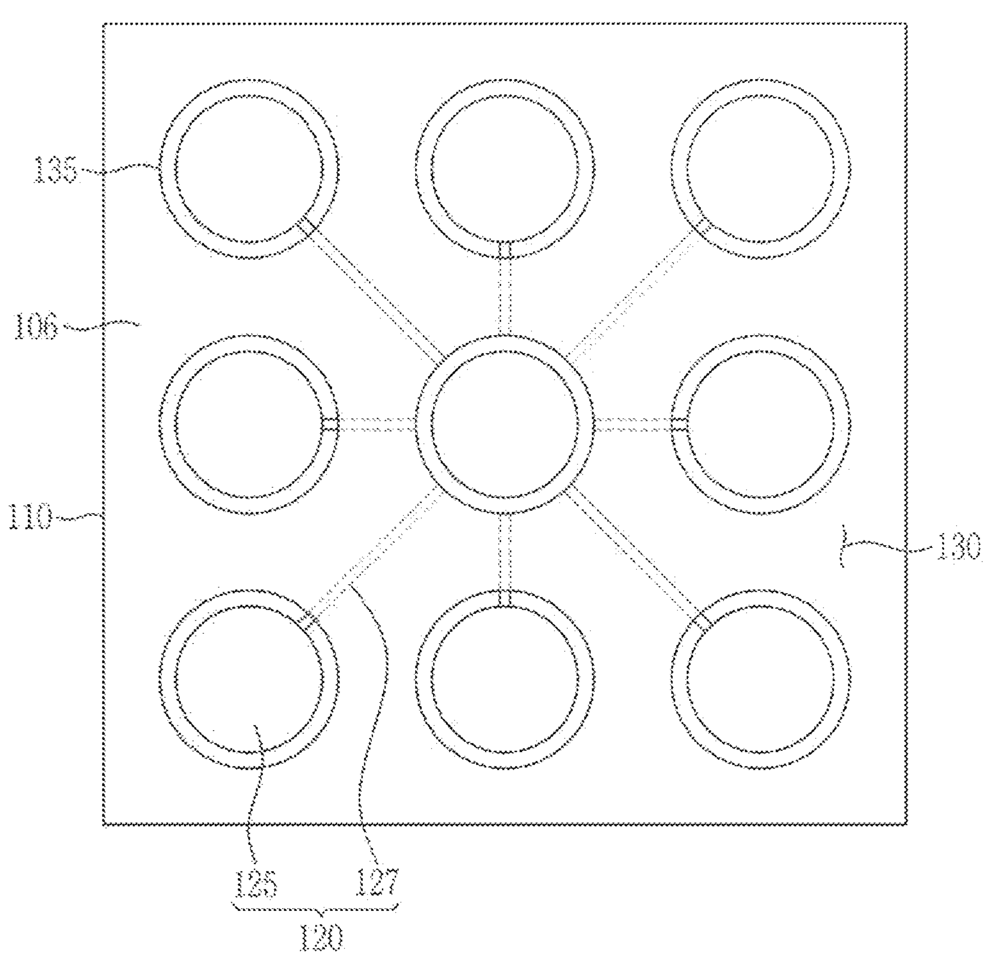
FIG. 3 is a top plan view showing another shape of one surface of a substrate in a semiconductor package according to an embodiment.
Figure 4:
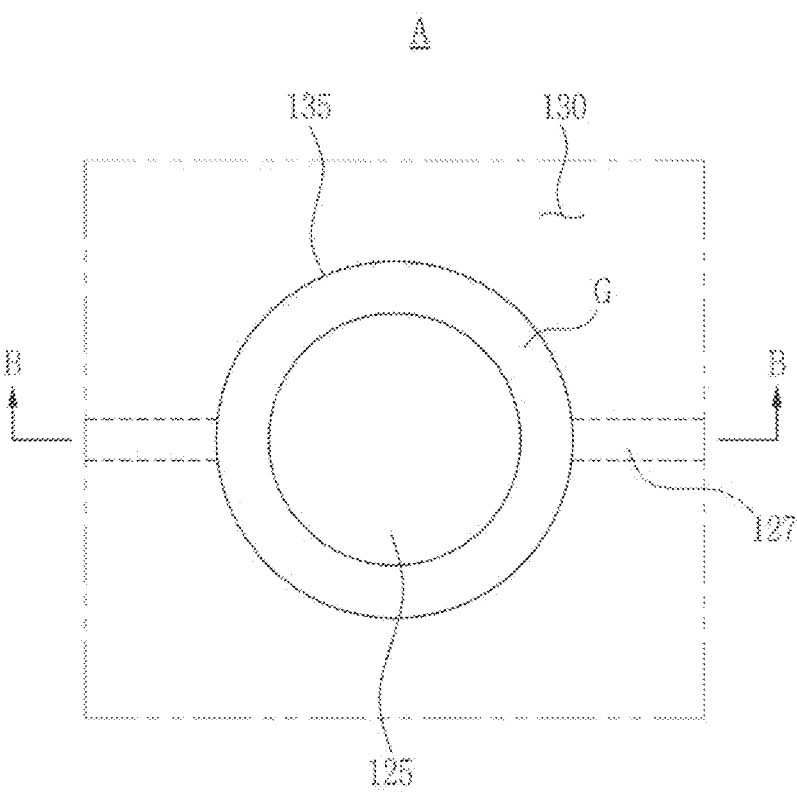
FIG. 4 is an enlarged top plan view of an area A of FIG. 2 according to an embodiment.
Figure 5:
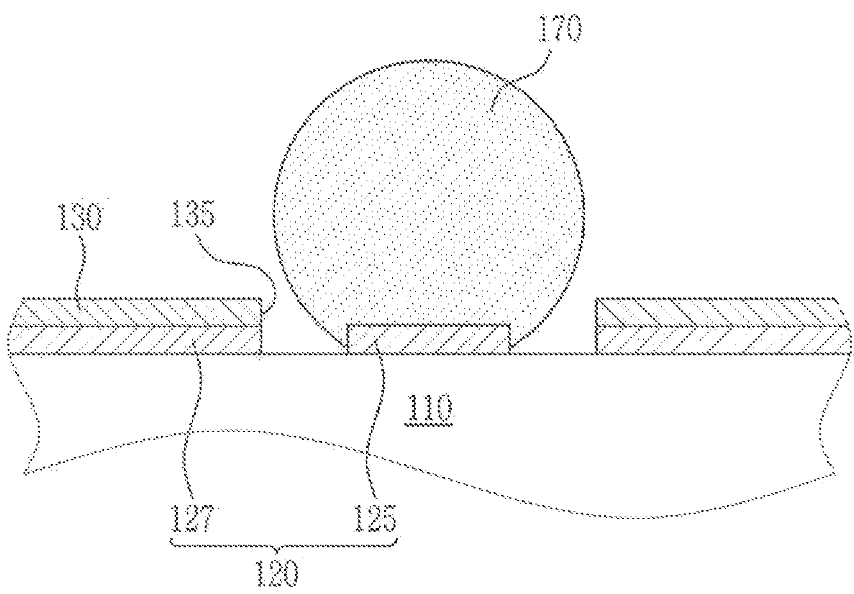
FIG. 5 is a cross-sectional view taken along direction B-B of FIG. 4 according to an embodiment.

FIG. 2 is a top plan view showing one surface of a substrate in a semiconductor package according to an embodiment, and FIG. 3 is a top plan view showing another shape of one surface of a substrate in a semiconductor package according to an embodiment. FIG. 4 is an enlarged view of an area A of FIG. 2, and FIG. 5 is a cross-sectional view taken along direction B-B of FIG. 4.

Referring to FIG. 2 to FIG. 5, a pattern layer 120 and a first protection layer 130 may be formed on a second surface 106 of a substrate 110.

In an embodiment, the pattern layer 120 may include one metal or an alloy of the metal. For example, the pattern layer 120 may include copper (Cu) or another metal having electrical conductivity. For example, a metal thin film including copper (Cu) may be stacked on the substrate 110, and patterned through a photolithography process in which exposure, development, and etching are performed to form a pattern layer 120. However, the method for forming the pattern layer 120 is not necessarily limited thereto, and the pattern layer 120 may be formed through various methods.

The pattern layer 120 may include a plurality of pads 125 and plating wires 127. In an embodiment, the plurality of pads 125 and plating wires 127 may have the same thickness.

The pattern layer 120 may be divided into a unit having a plurality of pads electrically connected to each other so as to perform the plating through one power source and plating wires electrically connecting the plurality of pads to each other. For example, referring to an embodiment shown in FIG. 2, the objects of the plating may be divided into a unit of three pads 125 constituting a row (e.g., an arrangement in a horizontal line). As another example, referring to an embodiment shown in FIG. 3, the objects of the plating may be divided into a unit of nine pads 125 constituting a 3×3 matrix having three rows (e.g., an arrangement in a horizontal line, vertical line and oblique line). However, embodiments of the present disclosure are not necessarily limited thereto, and the objects of the plating may be divided into various numbers and arrangements.

A plurality of pads 125 may be arranged in a regular shape such as a lattice shape. FIG. 3 shows that a plurality of pads 125 are arranged in the 3×3 matrix. However, embodiments of the present disclosure are not necessarily limited thereto. The pads 125 of the 3×3 matrix shown in FIG. 3 may show only a part of the entire pads arranged on the second surface 106 of the substrate 110.

In an embodiment, the pad 125 may have a circular shape on a plane. However, embodiments of the present disclosure are not necessarily limited thereto, and the pad 125 may have various shapes such as an oval, polygon, an irregular shape, etc.

The plating wire 127 is for electrically connecting the plurality of pads 125 during the plating process, and may be formed between adjacent pads of the plurality of pads 125, respectively. For example, referring to FIG. 2, the plating wire 127 may be arranged to extend from the two pads disposed on both lateral sides among the three pads 125 arranged in a line to the pad in the center, respectively. As another example, referring to FIG. 3, the plating wire 127 may be arranged to extend from eight pads disposed on the edges among the nine pads 125 arranged in a 3×3 matrix form to the pad in the center, respectively.

According to an embodiment, after the plating is performed, at least one pad among a plurality of pads 125 may be electrically separated from the plating wire 127. For example, the plating wire 127 may be formed to be physically separated from at least one pad so that a plurality of pads 125 are not electrically connected to each other. At this time, referring to FIG. 2 and FIG. 3, among a plurality of pads 125, the remaining pads except for the pad separated from the plating wire 127 may be connected to the plating wire 127.

For example, referring to FIG. 2, the plating wire 127 may be arranged to extend from the two pads disposed on both lateral sides among the three pads 125 arranged in a line to the pad in the center, and the pad in the center may be physically separated from the plating wire 127. As another example, referring to Fla 3, the plating wire 127 may be arranged to extend from the eight pads disposed on the edges among the nine pads 125 arranged in a 3×3 matrix form to the pad in the center, and the pad in the center may be physically separated from the plating wire 127, For example, there may be a gap (G, referring to FIG. 4 and FIG. 11) between one pad in the center and the plating wire 127.

However, the form shown in FIG. 2 and FIG. 3 are only examples and embodiments of the present disclosure are not necessarily limited thereto. For example, in an embodiment a plurality of the pads of the plurality of pads 125 or all of the pads of a plurality of pads 125 may be formed to be physically separated from the adjacent plating wire 127. Accordingly, after the plating is performed, the pads may be electrically separated, respectively.

A first protection layer 130 is formed on the second surface 106 of the substrate 110. The first protection layer 130 may be formed on (e.g., disposed directly thereon) the pattern layer 120 to cover the aforementioned pattern layer 120. The first protection layer 130 protects the surface of the substrate 110 from being exposed, and may include an electrically insulating material. For example, in an embodiment the first protection layer 130 may include a solder resist (SR) or a photo solder resist (PSR). However, embodiments of the present disclosure are not necessarily limited thereto and the composition of the first protection layer 130 may vary. In an embodiment, the first protection layer 130 may be formed through a printing process of applying a liquid SR or PSR ink to the surface of the substrate 110. However, embodiments of the present disclosure are not necessarily limited thereto and the first protection layer 130 may be formed through various different methods.

The first protection layer 130 may have a plurality of openings 135. A plurality of opening 135 may be formed in positions corresponding to a position of a plurality of pads 125 to expose the plurality of pads 125, Therefore, according to an embodiment, the first protection layer 130 may cover the plating wire 127 among the pattern layer 120.

According to an embodiment, the opening 135 may be formed to have a size that is larger than the pad 125. For example, in an embodiment a plurality of pads 125 formed on the second surface 106 of the substrate 110 may be formed as a pad 125 of a non-solder mask defined (NSMD) type. In an embodiment, the opening 135 may form a gap G with the pad 125 positioned therein. Therefore, according to an embodiment in which a pad 125 is separated without being directly connected to the plating wire 127, the pad 125 and the surface of the substrate 110 may be exposed through the opening 135. In addition, in an embodiment in which the pad 125 is directly connected to the plating wire 127 (e.g., is not separated therefrom), the pad 125, the surface of the substrate 110, and a portion of the plating wire 127 may be exposed through the opening 135.

In an embodiment, a plating layer may be formed on the pattern layer 120 in a portion exposed without being protected by the first protection layer 130 among the pattern layer 120. In an embodiment, the plating layer may include at least one of nickel (Ni) and gold (Au). For example, a plating layer may be formed on the surface of a plurality of pads 125.

FIG. 2 and FIG. 3 illustrate an embodiment in which all of a plurality of pads 125 are formed of the NSMD type. However, embodiments of the present disclosure are not necessarily limited thereto, and at least one of the plurality of pads 125 may be formed of the NSMD type and other of the plurality of pads 125 may be formed of a different type. For example, at least one pad separated from the plating wire 127 among a plurality of pads 125 may be formed of an NSMD type.

As described above, at least one pad among a plurality of pads 125 may be disposed in the gap G formed by the opening 135 and the at least one pad may be separated from the plating wire 127. Accordingly, a gap of the same size may be formed between at least one pad of a plurality of pads 125 and the plating wire 127, and between at least one pad above-described and the opening 135.

Referring to FIG. 5, the connection member 170 may be coupled to the pad 125. FIG. 5 illustrates an embodiment in which the connection member 170 is a solder ball as an example. However, embodiments of the present disclosure are not necessarily limited thereto. The first protection layer 130 may expose the pad 125 while being spaced apart from the pad 125 by the gap G. In addition, the first protection layer 130 may cover the plating wire 127 that is spaced apart from the pad 125 by the gap G.

Figure 6:
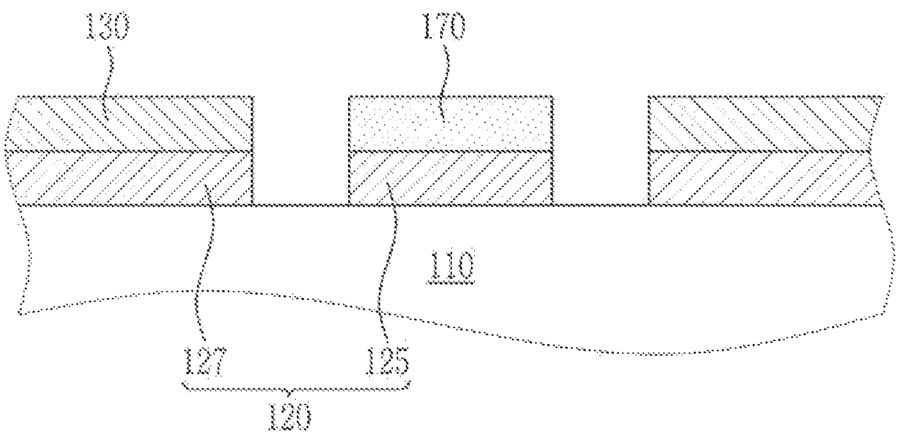

FIG. 6 is a cross-sectional view showing another form of FIG. 5. FIG. 6 as another example shows an embodiment in which the connection member 170 is a solder pad.

In an embodiment in which the connection member 170 is a solder ball, when the solder ball is bonded to the pad 125 of the NSMD type, the solder ball should be prevented from being melted and flowing down for electrical connection to the plating wire 127. A modified embodiment for this will be described.

Figure 7:
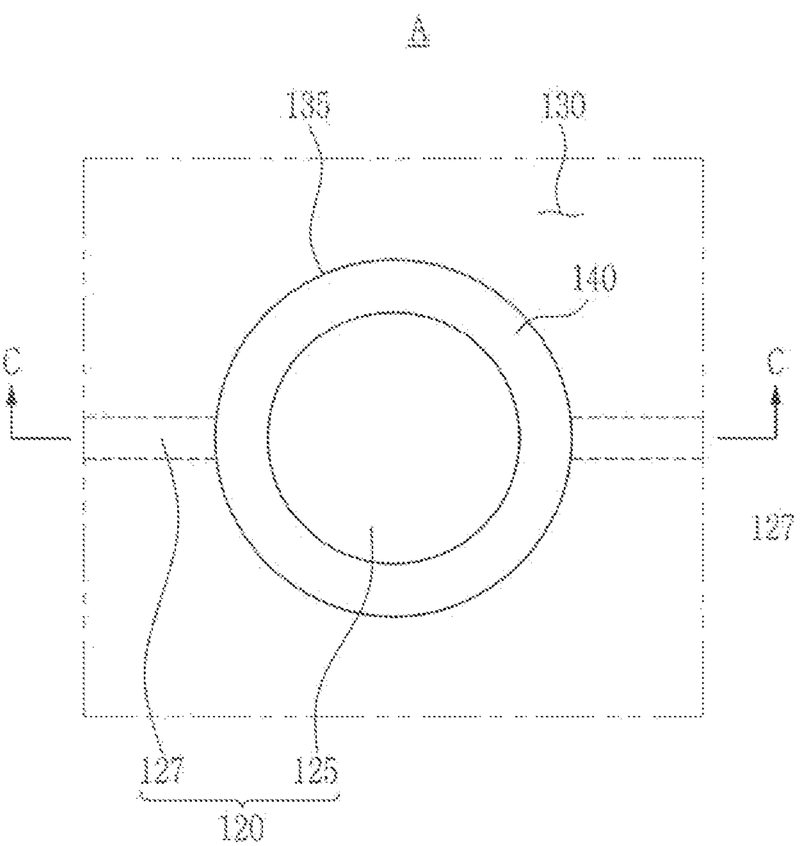
FIG. 7 is a plan view showing another fora of FIG. 4 according to an embodiment.
Figure 8:
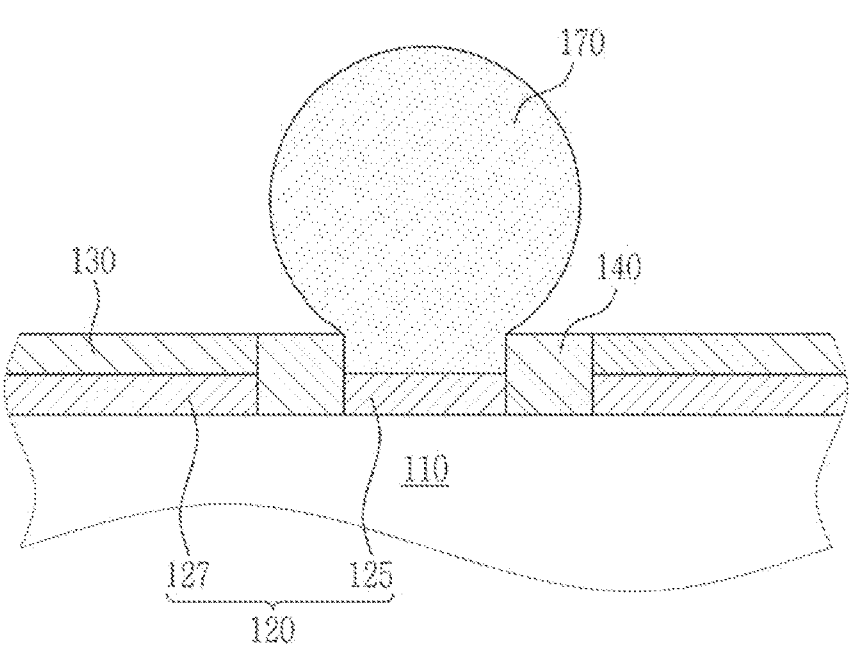
FIG. 8 is a cross-sectional view taken along direction C-C of FIG. according to an embodiment.

FIG. 7 is a plan view showing another form of FIG. 4, and FIG. 8 is a cross-sectional view taken along direction C-C of FIG. 7.

Referring to FIG. 7 and FIG. 8, a second protection layer 140 may be included in the gap G between the pad 125 and the plating wire 127 (or the first protection layer 130). In an embodiment, the second protection layer 140 may include an electrically insulating material, and may be formed of the same material as the first protection layer 1301. The second protection layer 140 may be formed by a method of filling the gap between the pad 125 and the plating wire 127 (or the first protection layer 130).

In an embodiment, the thickness of the second protection layer 140 (e.g., in a direction perpendicular to the extending direction of the second surface 106 of the substrate 110 may be greater than the thickness of the pad 125. Referring to FIG. 8, the second protection layer 140 may have a greater thickness than the pattern layer (120, pad or the plating wire) to prevent contact between the connection member 170 and the plating wire 127. For example, the top surface of the second protection layer 140 may be disposed at a same level as the top surface of the first protection layer 130. Since the pad 125 is formed to have a smaller thickness than the surrounding second protection layer 140, the connection member 170 may be stably bonded to the pad 125.

Hereinafter, a manufacturing method of the semiconductor package of an embodiment will be described.

FIG. 9 to FIG. 12 are views showing a manufacturing method of a semiconductor package according to embodiments of the present disclosure. FIG. 9 to FIG. 12 are cross-sectional views for convenience of explanation. In addition, although only one semiconductor package part is illustrated in the drawings for convenience of explanation, the semiconductor package may include a wafer level process, etc.

Figure 9:
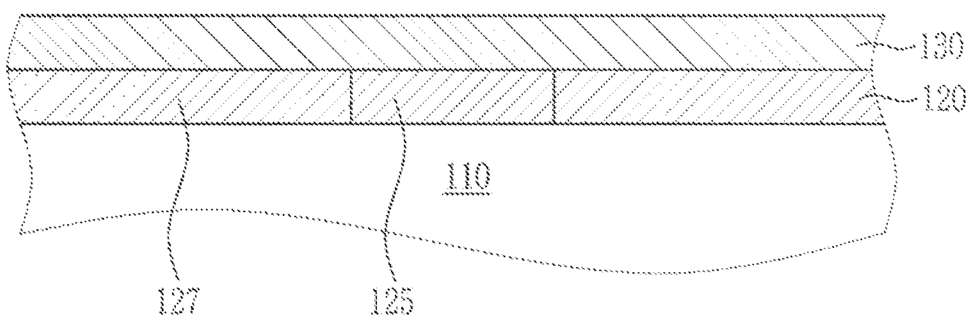
FIGS. 9-12 are cross-sectional views showing a manufacturing method of a semiconductor package according to embodiment.

FIG. 9 shows the step of forming the pattern layer 120 and the first protection layer 130 on the substrate 110. In the step of forming the pattern layer 120, a plurality of pads 125 and a plating wire 127 connecting between a plurality of pads 125 may be formed on the second surface 106 of the substrate 110, For example, in an embodiment after stacking a metal thin film including copper (Cu) on the substrate 110, a pattern layer 120 may be formed through a photolithography process in which exposure, development, and etching are performed. A plurality of pads 125 and a plating wire 127 connecting a plurality of pads 125 may be integrally formed.

In the step of forming the first protection layer 130, the first protection layer 130 may be formed on the substrate 110 on which the pattern layer 120 is formed. For example, in an embodiment the first protection layer 130 may be formed through a printing process of applying a liquid SR or PSR ink on the surface of the substrate 110. The first protection layer 130 may be stacked on (e.g., disposed directly thereon) the pattern layer 120 in the portion where the pattern layer 120 is disposed on the substrate 110, and may be stacked on (e.g., disposed directly thereon) the substrate 110 in the portion where the pattern layer 120 does not exist.

Figure 10:
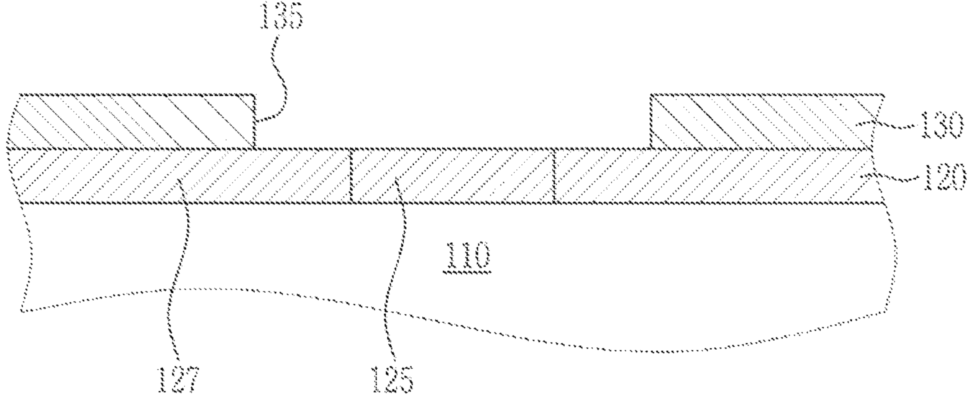

FIG. 10 shows a step in which the first protection layer 130 exposes a plurality of pads 125. Referring to FIG. 10, a plurality of openings 135 may be formed on the first protection layer 130. For example, in an embodiment a plurality of openings 135 may be formed on the first protection layer 130 through a photolithography process. However, embodiments of the present disclosure are not necessarily limited thereto.

The opening 135 may be formed to be larger than the pad 125. For example, the pad 125 of the NSMD type may be formed. Accordingly, the pad 125 and a portion of the plating wire 127 connected to the pad 125 may be exposed. Also, a gap G, (referring to FIG. 11) through which the surface of the substrate 110 is exposed, may be formed between the opening 135 and the pad 125.

In an embodiment, the gap G may be formed at a regular interval along the circumference of the pad 125. For example, in an embodiment the gap G may be greater than or equal to about 15 μm. If the gap G is less than about 15 μm, electrical separation between the pad 125 and the plating wire 127 may not be properly achieved. The gap G may not be formed continuously along the circumference of the pad 125, but may be formed discontinuously by the plating wire 127 connected to the pad 125.

Figure 11:
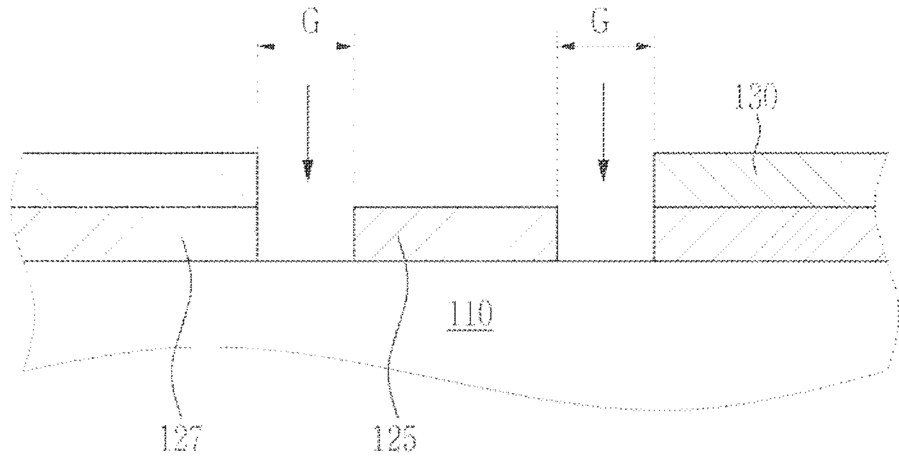

FIG. 11 shows the step of separating at least one pad 125 and the plating wire 127. Referring to FIG. of 11, the plating wire 127 at the circumference of the pad 125 may be removed. According to an embodiment, through the etching process, the plating wire 127 exposed in the gap G between the pad 125 and the opening 135 of the first protection layer 130 may be removed. Accordingly, the plating wire 127 of as much as the gap G is removed, and the gap G may be formed between the pad 125 and the plating wire 127. For example, the pad 125 and the plating wire 127 may be separated (e.g., spaced apart from each other) by the gap G.

On the other hand, according to an embodiment, in which a solder ball is formed as the connection member 170 on the pad 125, to prevent the solder ball from penetrating between the gap G while melting, a second protection layer 140 may be additionally formed in the gap G described above.

Figure 12:
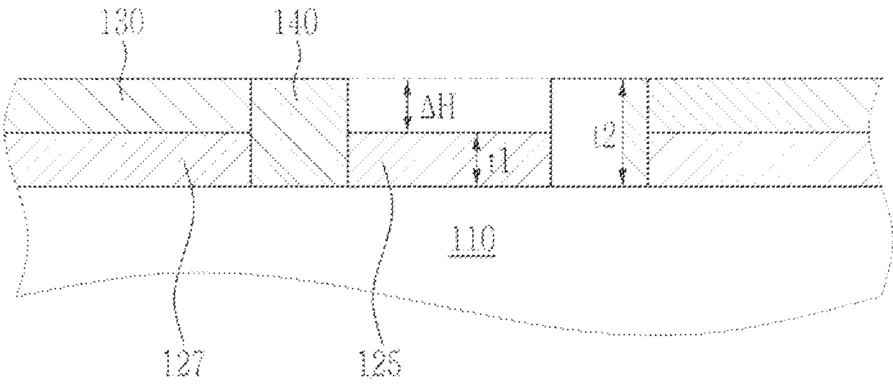
Figure 13:
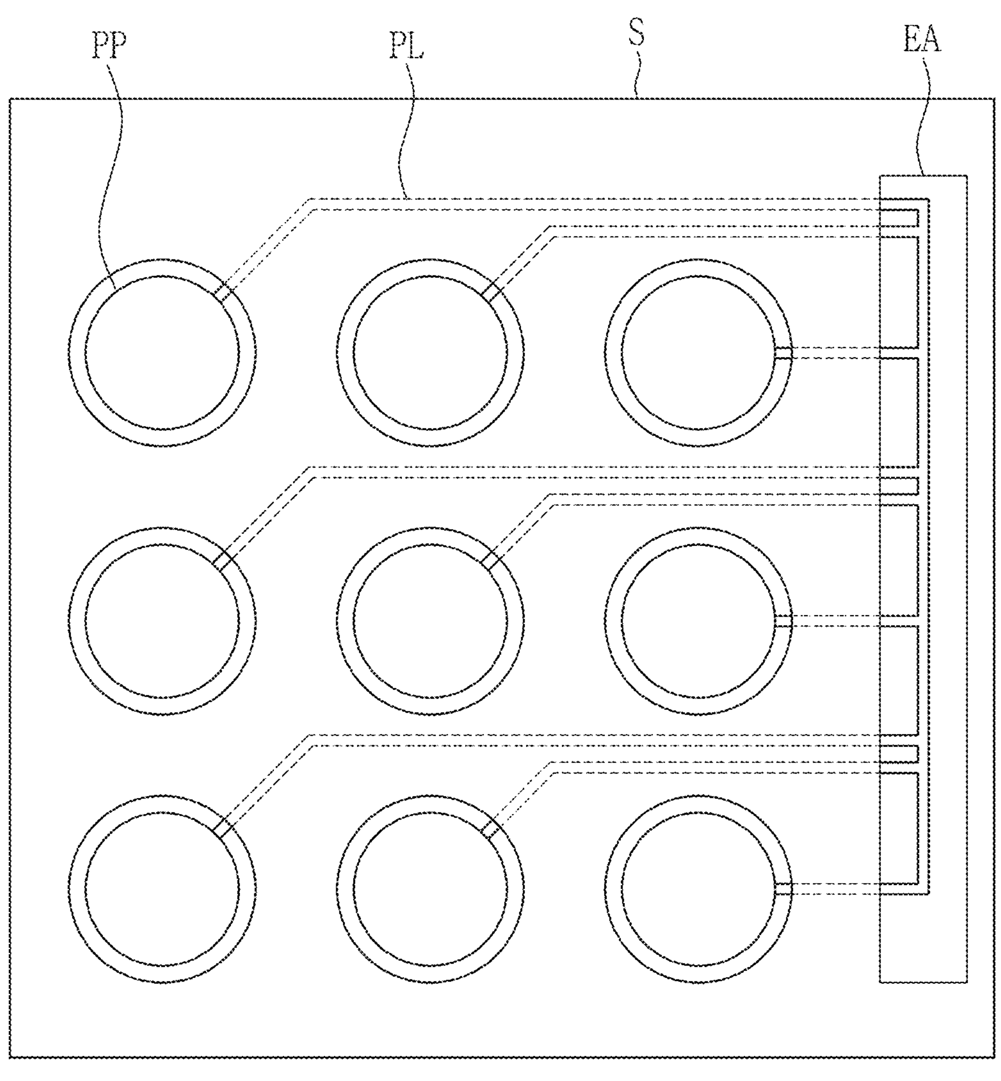
FIG. 13 is a plan view showing a substrate in a semiconductor package according to a comparative embodiment.

FIG. 12 shows the shape in which the second protection layer 140 is formed in the gap G between the pad 125 and the opening 135 of the first protection layer 130. Referring to FIG. 12, the plating wire 127 is removed in the previous process, and the second protection layer 140 may be filled in the gap G where the substrate 110 is exposed.

The second protection layer 140 may be made of an electrically insulating material. In an embodiment, the second protection layer 140 may be made of the same material as the first protection layer 130. As an example, the second protection layer 140 may include SR or PSR.

The thickness t2 of the second protection layer 140 may be larger than the thickness t1 of the pad 125. As an example, in an embodiment the thickness t2 of the second protection layer 140 may be the same as the thickness of the first protection layer 130. For example, the material constituting the second protection layer 140 may be filled in the gap G so that the upper surface of the second protection layer 140 is at the same level as the upper surface of the first protection layer 130. Accordingly, a top surface of the pad 125 is lower than the top surface of its surroundings, and a recess portion due to a height difference ΔH is generated in the upper portion of the pad 125, so that the connection member 170 may be stably bonded to the pad 125 through this.

Thereafter, the semiconductor chip 50 may be mounted on the first surface 103 of the substrate 110. Further, the semiconductor chip may then be encapsulated with an encapsulant. Also, referring to FIG. 5 and FIG. 0, a connection member 170 may be formed on the pad 125.

While this disclosure has been described in connection with embodiments, it is to be understood that the present disclosure is not necessarily limited to the disclosed embodiments. On the contrary, it is intended to cover various modifications and equivalent arrangements included within the spirit and scope of the present disclosure.

What is claimed is:

1. A semiconductor package comprising:

a substrate;

a pattern layer disposed on a first surface of the substrate, the pattern layer including a plurality of pads and a plating wire positioned between adjacent pads of the plurality of pads; and a first protection layer disposed on the first surface of the substrate to cover the pattern layer and expose the plurality of pads through an opening corresponding to each of the plurality of pads, wherein at least one pad of the plurality of pads is physically separated from the plating wire in the opening corresponding to the at least one pad.

2. The semiconductor package of claim 1, wherein:

a gap is disposed between the at least one pad, and the first protection layer and the plating wire.

3. The semiconductor package of claim 2, wherein the gap is greater than or equal to about 15 μm.

4. The semiconductor package of claim 2, wherein a second protection layer is disposed in the gap, the second protection layer is composed of an electrical insulation material.

5. The semiconductor package of claim 4, wherein a thickness of the second protection layer is greater than a thickness of the at least one pad.

6. The semiconductor package of claim 1, wherein:

the first protection layer includes a plurality of openings exposing the plurality of pads; and a gap is respectively formed between each opening of the plurality of openings and each pad of the plurality of pads.

7. The semiconductor package of claim 1, wherein:

all other pads of the plurality of pads except for the at least one pad are physically connected to the plating wire; and the first protection layer exposes a portion of the plating wire.

8. The semiconductor package of claim 6, wherein:

a plating layer is disposed on an exposed surface of the plurality of pads.

9. The semiconductor package of claim 1, further comprising:

a plurality of connection members bonded to the plurality of pads.

10. The semiconductor package of claim 1, further comprising:

a semiconductor chip mounted on a second surface of the substrate opposite to the first surface of the substrate.

11. A semiconductor package comprising:

a substrate;

a plurality of pads disposed on a first surface of the substrate;

a plating wire arranged to extend towards each pad of the plurality of pads and positioned between adjacent pads of the plurality of pads;

a first protection layer disposed on the first surface of the substrate, the first protection layer including a plurality of openings, wherein the first protection layer covers the plating wire, and exposes the plurality of pads through the plurality of openings;

a semiconductor chip mounted on a second surface of the substrate opposite to the first surface of the substrate; and a plurality of connection members bonded to the plurality of pads, the plurality of connection members electrically connecting the semiconductor chip to an external device;

wherein the substrate includes a wiring layer electrically connecting the semiconductor chip and the plurality of pads, and a gap is formed between at least one pad of the plurality of pads and the plating wire so that the at least one pad of the plurality of pads is physically separated from the plating wire in a corresponding opening of the plurality of openings.

12. The semiconductor package of claim 11, wherein:

a second protection layer is disposed in the gap, the second protection layer is composed of an electrical insulation material.

13. A manufacturing method of a semiconductor package, comprising:

forming a pattern layer on a first surface of a substrate, the pattern layer including a plurality of pads and a plating wire positioned between adjacent pads of the plurality of pads;

forming a first protection layer exposing the plurality of pads through an opening corresponding to each of the plurality of pads and covering the plating wire; and physically separating the plating wire from at least one pad by removing the plating wire on a circumference of the at least one pad among the plurality of pads in the opening corresponding to the at least one pad among the plurality of pads.

14. The manufacturing method of the semiconductor package of claim 13, wherein:

the first protection layer has a plurality of openings; and a gap is formed in each opening of the plurality of openings, the gap extends between the first protection layer and each pad of the plurality of pads.

15. The manufacturing method of the semiconductor package of claim 14, wherein:

in the physical separating of the plating wire from the at least one pad, the plating wire is exposed on the gap and is etched to be removed.

16. The manufacturing method of the semiconductor package of claim 15, wherein:

a second protection layer is formed on the gap where the plating wire is removed.

17. The manufacturing method of the semiconductor package of claim 16, wherein;

a thickness of the second protection layer is greater than a thickness of the at least one pad.

18. The manufacturing method of the semiconductor package of claim 15, wherein the gap is greater than or equal to about 15 μm.

19. The manufacturing method of the semiconductor package of claim 13, further comprising:

forming a plurality of connection members on the plurality of pads, the plurality of connection members electrically connecting the semiconductor package to an external device.

20. The manufacturing method of the semiconductor package of claim 13, further comprising:

mounting a semiconductor chip on a second surface of the substrate that is opposite to the first surface of the substrate; and encapsulating the semiconductor chip with an encapsulant.

* * * * *